United States Patent [19]

Guterman

[11] Patent Number: 4,490,812
[45] Date of Patent: Dec. 25, 1984

[54] USER REPROGRAMMABLE PROGRAMMED LOGIC ARRAY

[75] Inventor: Daniel C. Guterman, Plano, Tex.

[73] Assignee: Mostek Corporation, Carrollton, Tex.

[21] Appl. No.: 431,466

[22] Filed: Sep. 30, 1982

[51] Int. Cl.³ .............................................. G06F 1/00
[52] U.S. Cl. .................................... 364/900; 307/465
[58] Field of Search ... 364/200 MS File, 900 MS File, 364/716; 307/465

[56] References Cited

U.S. PATENT DOCUMENTS 4,034,356  7/1977  Howley et al. ................. 307/465
4,336,601  6/1982  Tanaka ............................ 364/900

Primary Examiner—Raulfe B. Zache
Attorney, Agent, or Firm—Eric W. Petraske

[57] ABSTRACT

A user-programmable and reprogrammable programmed logic array includes a self-indexing pointer to direct successive input signals to the proper cell within the array. A particular application is that of a ROM patch to correct coding errors in a ROM.

2 Claims, 2 Drawing Figures

USER REPROGRAMMABLE PROGRAMMED LOGIC ARRAY

TECHNICAL FIELD

The field of the invention is that of a programmed logic array circuit.

BACKGROUND ART

Programmed logic arrays (PLAs) comprising an AND matrix connected to an OR matrix in order to transform a certain logical input state to another output state have long been known in the art. It is also known for small PLAs to be programmed by the user, usually using bipolar technology and fusible links. These arrays have the drawbacks that the bipolar technology requires high power and only provides low circuit density, while the use of fusible links means that the device can be written only once.

DISCLOSURE OF INVENTION

The invention relates to a programmed logic array employing nonvolatile elements which may be both programmed and reprogrammed by the user. A feature of the invention is the use of a self-indexing pointer which automatically exposes the proper cell within the array to input signals generated by the user during programming.

Another feature of the invention is the provision of a ROM patch which is a particular configuration of the PLA, and which automatically replaces a faulty word within a read only memory and substitutes the correct word stored within the programmed logic array.

BEST MODE FOR CARRYING OUT THE INVENTION

Figure 1:
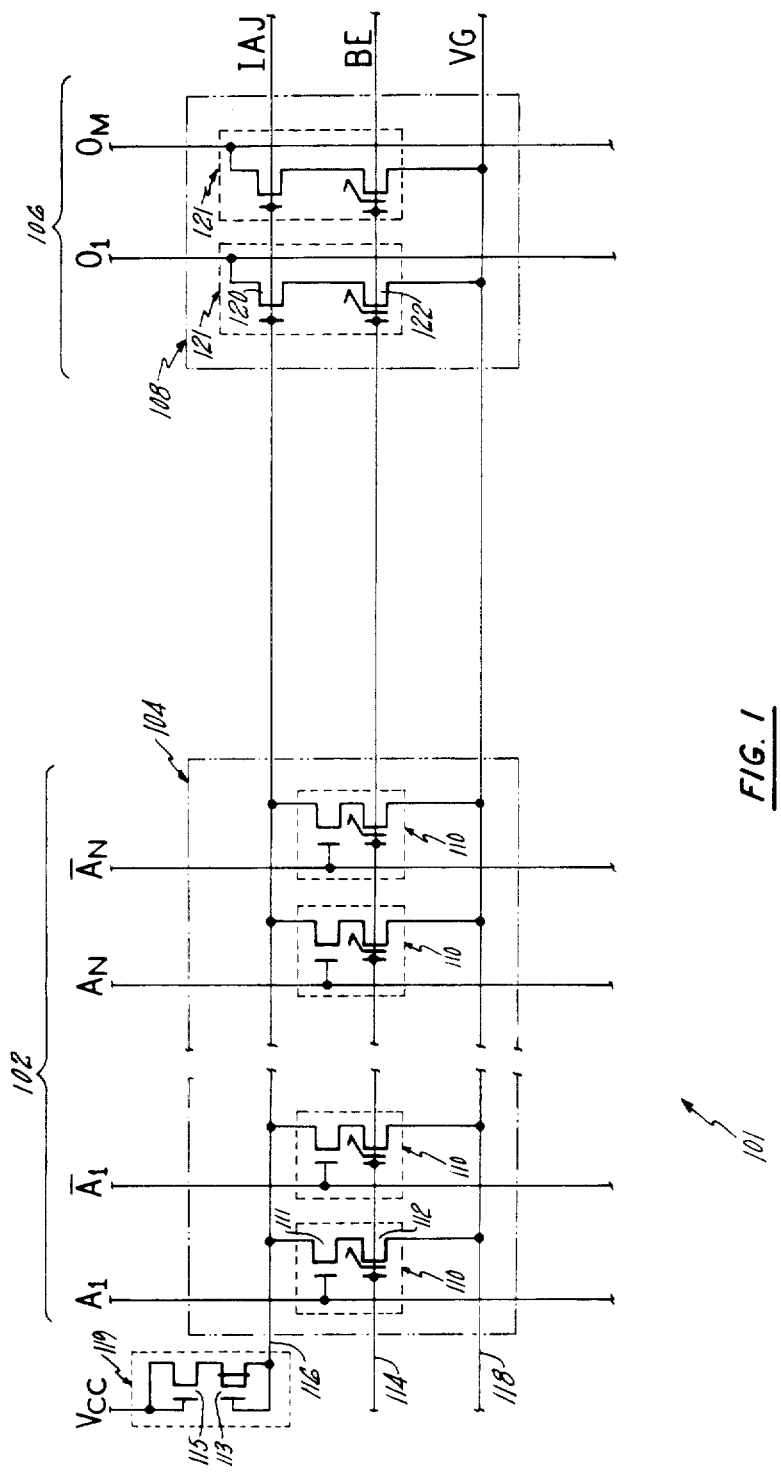
FIG. 1 illustrates a cell within the programmed logic array.

The overall organization of the subject programmed logic array is conventional, having input address lines and buffers, output address lines and buffers, chip enable circuits, flag circuits indicating read and write states, an AND matrix, an OR matrix and a cell pointer array. FIG. 1 illustrates schematically a portion of the AND and OR matrices of the Jth cell of the array, showing a set of 2N AND lines A1, $\overline{A1}$ up to AN and $\overline{AN}$, generally indicated as 102. These AND lines receive signals from an AND buffer (not shown) which generates the complement of the input data during write and connects the inverted data and its complement to the appropriate lines. These lines are connected throughout the AND matrix and pass through the Jth cell a portion of which is enclosed by a dotted line and is indicated as 104 in the diagram. A set of M OR lines O1 to OM, generally indicated as 106, passes through a portion of the OR matrix in the Jth cell, which is enclosed by a dotted line and is generally indicated as 108. Each of the AND lines 102 is connected to a subunit consisting of transistor 111 and a nonvolatile floating gate transistor 112, indicated together as 110 in the diagram. (Nonvolatile floating gate transistors are indicated by a symbol, introduced by Intel Corporation, indicating a control gate, a floating gate controlling a transistor and a tunnel oxide region indicated by a "V" element.) Each gate of transistor 111 is connected to the appropriate AND line 102. Each control gate of a floating gate transistor 112 is connected to bulk erase line 114 which is common to the entire AND and OR matrix and to the self-indexing pointer cells described below. Each drain of transistor 111 is connected to internal address line IAJ (line 116) which is confined to the Jth cell. The source of transistor 111 is connected to the drain of transistor 112. Each source of floating gate transistor 112 is connected to virtual ground line 118 which is common to the entire AND and OR matrix.

In the OR matrix portion of the Jth cell, indicated as 108 in the diagram, a similar subunit 121 consists of transistor 120 with its drain connected to a corresponding OR line of 106, its gate connected to internal line 116 and its source connected to the drain of floating gate transistor 122 which has its control gate connected to bulk erase line 114 and its source connected to virtual ground line 118. Internal address line IAJ is pulled up to VCC by pull-up 119 comprising transistor 115 and transistor 113 connected in a conventional manner of a pull-up.

In read operation, which externally may use TTL levels, a set of signals A1, $\overline{A1}$ to AN, $\overline{AN}$ is placed on the corresponding lines 102 of the AND matrix. When a match is achieved with a stored address, as is indicated below, all of the elements 110 will be turned off so that there will be no path from internal address line 116 to virtual ground 118 (which is at 0 volts) and internal address line 116 will be pulled up by pull-up 119 to a logical 1 level (about 5 volts). This 5 volt level, being connected to the gates of transistors 120, will turn on elements 121 which expose the corresponding OR lines 106 of the OR portion 108 of the matrix to the data stored within floating gate transistors 122. In other words, when the appropriate logic state indicated by A1 to AN is matched with a stored set of bits in the Jth cell of the AND matrix, then the data stored on floating gate transistors 122 in the OR matrix will be connected to OR lines 106 (O1 to OM) and then to the output lines. In the decoding operation within section 104 of the AND matrix, data stored on the nonvolatile floating gate transistors 112 is matched with the input signal. If, for example, the A1 line is high, transistor 111 connected to that line will be on and it is necessary that transistor 112 connected to transistor 111 be off in order to prevent internal address line 116 from being pulled down to ground level. If A1 is high, $\overline{A1}$ will be low, transistor 111 connected to the A1 line will be off, cutting off conduction despite the fact that the state of floating gate transistor 112 connected in that element 110 and assoicated with $\overline{A1}$ is on, a requirement in order to pull down line 116 for a different address. This cell of a programmed logic array is generally usable for the purposes of programmed logic arrays, i.e. to perform a logical transformation from a given input state to a corresponding output state. The voltages on the cell are indicated in State Table I for the case when A is at 0 volts. Those skilled in the art will readily be able to construct a counterpart table for the case for A is at 21 volts.

In one particular application, that of a ROM patch, the application is that of replacing an incorrect memory word in a read only memory with a corrected version. In that case, the input to the

STATE TABLE I

| MODE | A | $\bar{A}$ | I/O | IA | E | VG |
|---|---|---|---|---|---|---|
| ERASE | 0 | 0 | 0 | 4.5V | 21V | 0 |
| WRITE INH. | 0 | 21V | DATA IN 0 or 21V | 4.5V | 0 | FLOAT |
| WRITE | 0 | 21V | DATA IN 0 or 21V | 21V | 0 | FLOAT |
| READ VALID | 4.5V | 0 | DATA OUT E or P | 4.5V | 0 | 0 |
| READ INVALID | 0 | 4.5V | — | 0 | 0 | 0 |

AND array 104 will be the address carried on lines A1 to AN of the faulty memory word. When such an address is decoded, internal address line 116 will go high turning on output portion 108 of the Jth cell and putting out on the output lines O1 to OM the contents of a substitute memory word. Conventional overhead circuitry on the chip will recognize that one of the internal address lines has gone high and will put out a disable signal which disables the ROM which is being corrected so that the output of the ROM patch circuit will be substituted for the faulty data in the ROM.

The usefulness of a ROM patch has long been known to those skilled in the art. It is well known that it is easy to get nearly all of the coding of a software program correct, but it is quite difficult to get every line correct. This difficulty and consequent long time for testing and debugging has been a serious economic factor cutting against the use of read only memory. The read only memory chips are considerably less expensive than UV erasable EPROM, EEPROM or random access memory chips to fabricate, but it is necessary to commit to a ROM design and, hence, to commit the software long in advance. That, in turn, means that an extensive testing program is required to be sure that the software is perfect before a production line is committed.

With the advent of a reasonable amount of ROM patch, it will be possible to commit to a ROM design when the software is only 99% perfect, say, and to rely on the use of the patch to furnish the remaining corrections. Previous ROM patches have been able to provide only a very small amount of correction, typically less than 0.1% of the total ROM in question. Practical applications require much more correction than this, at least 1%.

Figure 2:
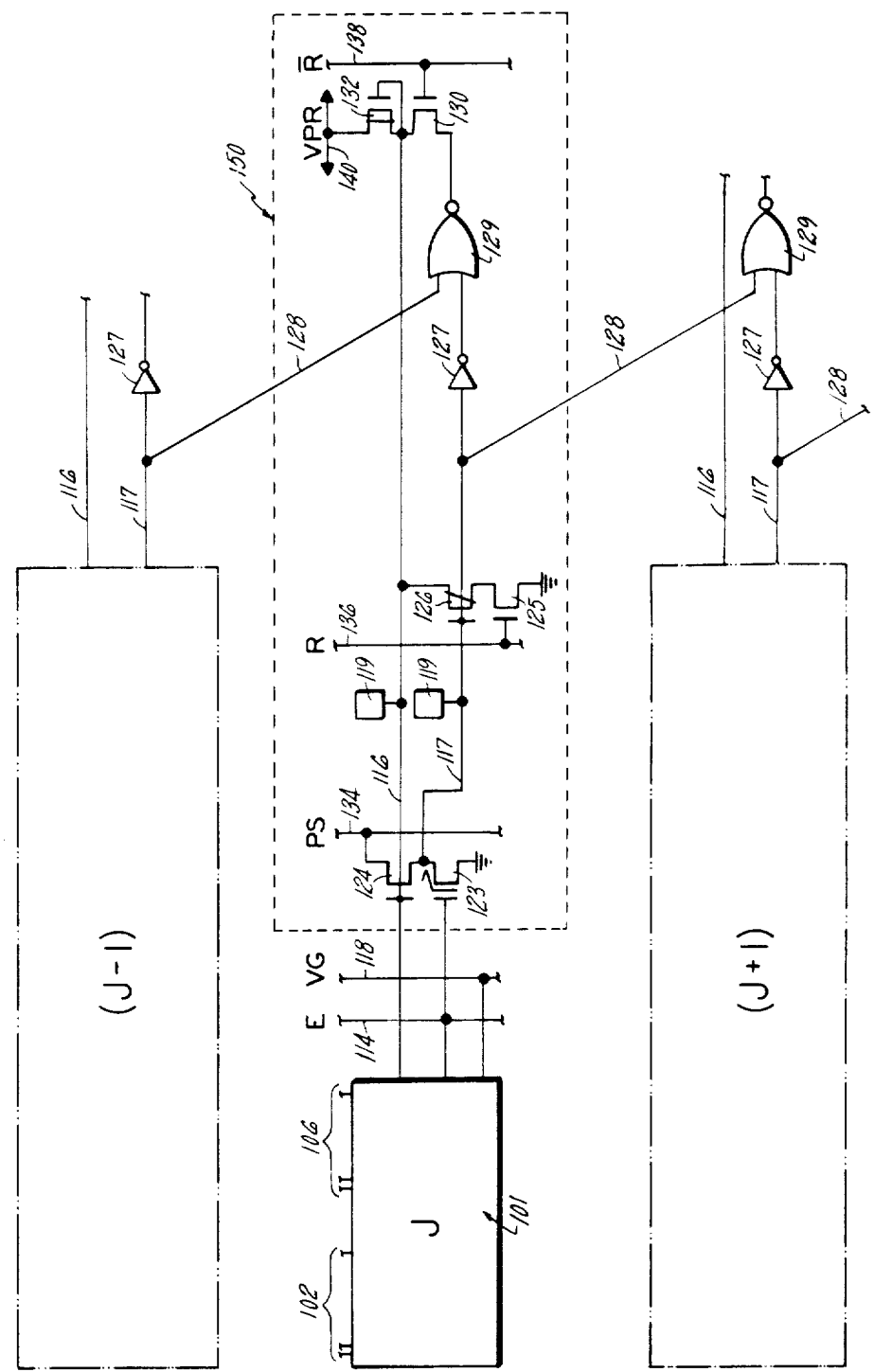
FIG. 2 illustrates the cell of FIG. 1 together with a portion of the self-indexing pointer.

An important feature of a user programmable array is that the usage be simple. Accordingly, it is highly desirable that the user not have the burden of keeping track of how many cells in the array have been filled and what the next cell to be written is. It is an advantageous feature of the invention that an automatic indexing pointer provides a chip empty signal, a chip full signal, an enabling signal for the next cell to be written into and a disabling signal for those cells which have been written into or are not due to be written. In FIG. 2, patch cell J (101) is indicated by a box the contents of which are shown in FIG. 1. The remainder of the circuit, indicated generally as 150 in the diagram, is the Jth portion of the automatic pointing circuit containing one nonvolatile unit comprising floating gate transistor 123 and transistor 124, together with the components described below. The gate of transistor 124 is connected to internal address line 116 which extends into the Jth patch cell 101. The Jth internal address line 116 is connected to pull-up 119 which is repeated again in FIG. 2 for convenience in explanation. Internal line 117 is connected from the drain of floating gate transistor 123; is pulled up by a second pull-up 119; is connected to the gate of enhancement transistor 126 and connected to inverter 127 which feeds into NOR gate 129. The other input to NOR gate 129, shown as line 128 in FIG. 2, comes from the corresponding 117 line of the P(J-1) pointer bit. The output of NOR gate 129 is connected to the source of enhancement mode transistor 130, the drain of which is connected to internal line 116. Depletion mode transistor 132 is connected between line 116 and a signal VPR on line 140 which is common to all internal address lines and is a program voltage signal that may be either 5 volts or 21 volts depending on operating mode. These pointer circuits are also crossed by a number of chip-wide lines: a pointer store line (PS) 134, read line (R) 136 and a read bar line ($\bar{R}$) 138.

In the case where patch cell J (101) is next to be written into, the operation of the pointer circuit will be discussed. The voltages on the pointer circuit are indicated in State Table II. During the initialization or erase procedure, all the nonvolatile bits of floating gate transistors 123 were cleared so that their transistors were initially off. Note that this initialization process also clears all nonvolatile bits in the AND and OR matrix, 112 and 122, correspondingly. As each cell is written into, its nonvolatile gate transistor is turned on, so that transistor 123 of the (J-1)th patch cell will have been turned on, establishing a path between line 117 of the (J-1)th cell and ground, pulling line 117 of the (J-1)th cell to a logical zero. Input 128 of NOR gate 129, connected to line 117 of the (J-1)th cell, will thus be low. Floating gate transistor 123 of the Jth patch cell will still be off as a result of the initialization procedure and line 117 of the Jth cell will be pulled up by pull-up 119 and will be a logical 1. That logical 1 will be inverted in inverter 127 so that both inputs of NOR gate 129 will be low and the output will be high. The high output of NOR gate 129 feeds through transistor 130 which is controlled by the $\bar{R}$ signal (138) which is held high during write so that internal address line 116 of the

STATE TABLE II

| MODE | E | VG | PS | R | $\bar{R}$ | VPR | $P_J$ | $P_{J-1}$ | $IA_J$ |
|---|---|---|---|---|---|---|---|---|---|
| ERASE | 21V | 0 | 0 | 4.5V | 0 | 4.5V | 0 | 0 | 4.5V |
| WRITE INH.-SELECTED | 0 | FLOAT | 21V | 0 | 4.5V | 4.5V | 4.5V | 0 | 4.5V |
| WRITE INH.-NON-SELECTED | 0 | FLOAT | 21V | 0 | 4.5V | 4.5V | $\frac{4.5V}{0}$ | $\frac{4.5V}{0}$ | 0 |
| WRITE-SELECTED | 0 | FLOAT | 21V | 0 | 4.5V | 21V | 4.5V | 0 | 21V |
| WRITE-NON-SELECTED | 0 | FLOAT | 21V | 0 | 4.5V | 21V | $\frac{4.5V}{0}$ | $\frac{4.5V}{0}$ | 0 |
| READ-SELECTED | 0 | 0 | SA[3] | 4.5V | 0 | 4.5V | 0 | X | $0^2$ or 4.5V |
| READ- | 0 | 0 | SA | 4.5V | 0 | 4.5V | 4.5V | X | 0 |

STATE TABLE II-continued

| MODE | E | VG | PS | R | $\overline{R}$ | VPR | $P_J$ | $P_{J-1}$ | $IA_J$ |
|---|---|---|---|---|---|---|---|---|---|
| NON-SELECTED | | | | | | | | | |

NOTES:
(1) # Nonvolatile Bits = $[2 \times N + M + 1] \times L$
(2) Conditional on VALID ADDRESS (3) To sense AMP $\begin{pmatrix} PS = 4.5V \text{ for INVALID ADDRESS} \\ = 0V \text{ for VALID ADDRESS} \end{pmatrix}$ SYMBOL DESCRIPTION:
PS — POINTER STORE
VPR — PROGRAM VOLTAGE
R — READ
$P_J$ — Jth POINTER Jth cell will be held high. The logic for all other pointers will result in their respective NORs (129) to output a logical 0, or 0 volts, forcing the 116 lines of those pointers to 0 volts. During the write sequence, pointer store line 134 will be brought up to a nominal value of 21 volts for the purpose of writing a nonvolatile element. Since all the other lines 116 of the patch cells exclusive of J will be held low during the write operation, only the line 116 of the Jth patch cell being high, only one NV pointer transistor 123 will be exposed to the 21 V signal, along with its associated J cell which is tied to internal address 116.

The pointer index is set during the write inhibit time shown in State Table II, which is the time in which the addresses and data are set up and allowed to stabilize. At that time, line 117 of the Jth cell is set to a logical 1, and line 117 of the (J-1)th cell remains at a logical 0 so that the internal address line 116 of the Jth cell is at a logical 1 while all the other internal address lines 116 remain at a logical 0. During the write sequence, the VPR signal goes to 21 volts which results in internal address line 116 of the Jth cell also going to 21 volts while internal addresses of all other cells remain at 0 volts. The high voltage of the VPR signal feeds through transistor 132 which serves as a load to isolate the different cells and limit the current flowing from the VPR source onto line 116. During or prior to write, the PS signal line 134 also goes to a 21 volt signal level in order to program nonvolatile pointer transistor 123. Internal line 117 remains high even when the nonvolatile transistor 123 is changing to the on state because it is impossible for the floating gate of transistor 123 to be sufficiently discharged when the field is applied that line 117 is pulled to a logical 0 level. It has been found experimentally that, in a configuration such as this, the lowest level at which the drain of transistor 123 can go is approximately 10 volts so that line 117 does not go to a logical 0 until the end of the write operation when the 21 volts is removed from the cell.

With internal address line 116 held high, data is applied to the address lines and output lines of patch cell J. The A and $\overline{A}$ signal are applied at normal logic levels by the decoding circuitry in inverted fashion so that the "true" or noninverted address will be recognized when the data is applied for read. If the Ith A line, AI, is to be high during read, that implies that the corresponding transistor 111 will be on and therefore the corresponding nonvolatile transistor 112 must be turned off. The corresponding $\overline{AI}$ line will be low during the read operation which implies that transistor 111 will be off. The corresponding nonvolatile transistor 112 is meant to be turned on in order to pull down line 116 when an incorrect address is applied. During the write operation, as is shown in State Table I, the corresponding A or $\overline{A}$ lines are high at 21 volts, the virtual ground is floating and the various lines of the OR matrix are either 0 or 21 volts corresponding to the data to be outputted.

It often happens in the use of programmed logic arrays that some one or more of the bits in the AND matrix will be in a "don't care" state, i.e. it does not matter whether the particular bit is high or low. A simple way of accommodating this feature is to do a two pass write sequence, with the first pass ordinarily being a dummy write. In the case of "don't care", the two passes will be opposite for the "don't care" bits, so that both transistor 112 of AN and $\overline{AN}$ will remain turned off so that line 116 will not be pulled down regardless of the value of the input AN.

The particular embodiment described has a number of nonvolatile bits equal to the quantity $2 \times N + M + 1$ per cell times the number of cells. If, for example, 400 bits were to be put on a chip, the number of nonvolatile bits required would be $(2 \times 15 + 8 + 1) \times 400$ in the particular case of an 8-bit word. The total quantity of nonvolatile bits would be approximately 16,000, a degree of density that is comparable to a "state-of-art" E²PROM and is readily achievable.

A further desirable feature of the particular application of a ROM patch cell is that the speed be sufficiently high so that a ROM disable signal coming from the patch will disable the ROM being affected in sufficient time so that the correct data stored on the patch may be recalled without interference from the ROM. If speed becomes a problem, the simplest way to cope with it is to have the central control unit go into a wait state when the patch becomes active so that there is ample time for the patch cell to operate.

The invention described above does not depend on one particular form of nonvolatile bit. The invention has been described with respect to a floating gate cell employing tunneling oxide. However, a three-level poly gate or a MNOS gate could also be used with appropriate adjustments to control signals and voltages. The implementation of these different bits will be simple for those skilled in the art in the light of the foregoing disclosure. Similarly, it is not necessary to have any particular self-indexing pointer array. The particular one described above has the virtue of great simplicity. Other pointer arrays which have more sophistication will be evident to those skilled in the art, including those in which individual patch cells may be addressed out of sequence.

I claim:
1. A programmable logic array comprising:
   a plurality of pattern-matching modules, each of which is responsive to a predetermined pattern of input logical signals for generating a pattern recognition signal; and a plurality of logical output modules, each of which is responsive to a pattern recognition signal from one of said plurality of pattern-matching modules, for outputting a plurality of predetermined output signals, characterized in that:

said pattern-matching modules and said logical output modules include a plurality of electrically alterable nonvolatile member elements for storing a predetermined input data pattern, which nonvolatile memory elements may be repeatedly altered; and said predetermined pattern of input logical signals is written into said plurality of pattern-matching modules under the control of a self-indexing pointer circuit.

2. A programmable logic array according to claim 1, further characterized in that said self-indexing pointer circuit includes a plurality of pointer cells each of which contain an electrically alterable nonvolatile memory element and means connecting said pointer cell with at least one other pointer cell next in sequence.

* * * * *